(12) United States Patent
Tang (10) Patent No.: US 10,847,239 B2
(45) Date of Patent: Nov. 24, 2020

(54) ANALOG TRACK-AND-HOLD INCLUDING FIRST-ORDER EXTRAPOLATION

(71) Applicant: Analog Devices, Inc., Norwood, MA (US)

(72) Inventor: Andrew T. K. Tang, San Jose, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 65 days.

(21) Appl. No.: 16/133,338

(22) Filed: Sep. 17, 2018

(65) Prior Publication Data

US 2019/0088347 A1 Mar. 21, 2019

Related U.S. Application Data

(60) Provisional application No. 62/560,035, filed on Sep. 18, 2017.

(51) Int. Cl.
*G11C 27/02* (2006.01)
*G06G 7/184* (2006.01)
*H03M 1/08* (2006.01)

(52) U.S. Cl.
CPC .......... *G11C 27/026* (2013.01); *G06G 7/184* (2013.01); *G11C 27/024* (2013.01); *H03M 1/0863* (2013.01)

(58) Field of Classification Search
None
See application file for complete search history.

(56) References Cited

U.S. PATENT DOCUMENTS

| 4,150,310 A | 4/1979 | Emile, Jr. |
| 5,124,576 A * | 6/1992 | Jensen ................. G11C 27/026 327/68 |

(Continued)

FOREIGN PATENT DOCUMENTS

WO WO-2019055935 A1 3/2019

OTHER PUBLICATIONS

"First-order hold", [Online]. Retrieved from the Internet: <URL: https://en.wikipedia.org/wiki/First-order_hold, (Accessed Sep. 18, 2017), 5 pgs.

(Continued)

*Primary Examiner* — Cassandra F Cox
(74) *Attorney, Agent, or Firm* — Schwegman Lundberg & Woessner, P.A.

(57) ABSTRACT

A dynamic error introduced by track-and-hold circuits can be reduced by using an input signal derivative to perform linear extrapolation during the hold period, allowing the output of the track-and-hold circuit to provide improved performance in reconstructing an undistorted input waveform, or to perform other applications such as demultiplexing. As described herein, a track-and-hold circuit and related techniques can include use of a first-order (e.g., linear) extrapolation. A first-order extrapolation can better approximate or reconstruct a signal during a specified hold duration, as compared to a zeroth-order technique. Use of analog circuits to implement the first-order extrapolation can one or more of reduce complexity of a circuit implementation or improve performance, such as by not requiring digital signal processing circuitry in performing the extrapolation.

22 Claims, 8 Drawing Sheets

(56) References Cited

U.S. PATENT DOCUMENTS

| | | |
|---|---|---|
| 5,689,201 A | 11/1997 | Temes et al. |
| 5,734,276 A | 3/1998 | Abdi et al. |
| 6,654,469 B1 | 11/2003 | Nelson et al. |
| 7,640,281 B2 | 12/2009 | Kirkland |
| 10,375,336 B2 * | 8/2019 | Ramakrishnan ....... H04N 5/378 |
| 2007/0108951 A1 | 5/2007 | Coleman |
| 2017/0302173 A1 | 10/2017 | de Cremoux |

OTHER PUBLICATIONS

"MT-090 Tutorial: Sample-and-Hold Amplifiers", Analog Devices, (2009), 21 pgs.

Yang, Chifu, et al., "Improving the Closed-Loop Tracking Performance Using the First-Order Hold Sensing Technique with Experiments", arXiv:1801.01263, (Jan. 4, 2018), 10 pgs.

"International Application Serial No. PCT US2018 051372, International Search Report dated Jan. 10, 2019", 3 pgs.

"International Application Serial No. PCT US2018 051372, Written Opinion dated Jan. 10, 2019", 3 pgs.

* cited by examiner

ANALOG TRACK-AND-HOLD INCLUDING FIRST-ORDER EXTRAPOLATION

CLAIM OF PRIORITY

This patent application claims the benefit of priority of Tang, U.S. Provisional Patent Application Ser. No. 62/560,035, titled "ANALOG TRACK-AND-HOLD INCLUDING FIRST-ORDER EXTRAPOLATION," filed on Sep. 18, 2017, which is hereby incorporated by reference herein in its entirety.

FIELD OF THE DISCLOSURE

This document pertains generally, but not by way of limitation, to apparatus and techniques for performing a track-and-hold operation to process an electrical signal, and more particularly, to various circuit topologies and techniques for performing a track-and-hold operation.

BACKGROUND

Electrical signals can be corrupted, such as at regular or specified intervals, such as when subjected to chopping in a chopped-amplifier circuit or when time-division multiplexed, as illustrative examples. In one approach, reconstruction of a corrupted signal can include using a zeroth-order track-and-hold technique or filtering, or a combination of both. Such an approach can provide a final output or an intermediate output for further processing. Generally, in a zeroth-order track-and-hold circuit, an output signal is held constant during the hold mode or hold "phase." As an illustrative example, chopping circuits can be used in precision measurement systems or other systems to suppress or inhibit error, such as offset error. Undesirable transients can occur when a chopper circuit switches from one chop state to another state. These transients can be reduced using one or more of a track-and-hold technique (e.g., a "zeroth" order approach) or filtering. But, such approaches can present challenges. For example, zeroth-order track-and-hold circuits can introduce dynamic errors if the signal changes significantly during the hold phase, and use of filtering generally introduces delay.

SUMMARY OF THE DISCLOSURE

As mentioned above, a track-and-hold circuit and related techniques can include use of a specified track duration and a specified hold duration. For example, during the specified track duration (e.g., a track phase or a track state), and output of the track-and-hold circuit can follow or "track" the input signal, such as in a one-to-one manner if the track-and-hold circuit has a unity-gain configuration. During the specified hold duration (e.g., a hold phase or a hold state), for a zeroth-order track-and-hold approach, the output can be held constant, such as representing a sample of an input signal.

The present inventor has recognized, among other things, that use of a zeroth-order track-and-hold approach can present challenges. For example, track-and-hold circuits can introduce dynamic errors if the input signal changes significantly during the hold phase, and filtering generally introduces delay. If a dynamic error from track-and-hold circuits can be reduced, filtering techniques need not be as stringent (e.g., less complex filter topologies can be used or less filtering can be performed), resulting in one or more of smaller die area, better performance due to faster response times (e.g., less delay), or improved accuracy.

To address the challenges mentioned above, the present inventor has also recognized that a dynamic error introduced by track-and-hold circuits can be reduced by using an input signal derivative to perform linear extrapolation during the hold period, allowing the output of the track-and-hold circuit to provide improved performance in reconstructing an undistorted input waveform, or to perform other applications such as demultiplexing. As described herein, a track-and-hold circuit and related techniques can include use of a first-order (e.g., linear) extrapolation. A first-order extrapolation can better approximate or reconstruct a signal during a specified hold duration, as compared to a zeroth-order technique. The present inventor has also recognized that use of analog circuits to implement the first-order extrapolation can one or more of reduce complexity of a circuit implementation or improve performance, such as by not requiring digital signal processing circuitry in performing the extrapolation.

In an example, an electronic circuit can be used to provide an extrapolation of an input signal during a specified hold duration. The electronic circuit can include an analog amplifier circuit coupled to or comprising an analog storage circuit, the analog storage circuit controllably coupled to an input node to store an analog representation of the input signal, and the amplifier circuit comprising an output configured to provide, during the specified hold duration, an extrapolated representation of the input signal using the analog representation of the input signal and an analog representation of a slew rate of the input signal, along with a control circuit configured to controllably isolate the analog storage circuit from the input during the specified hold duration. Optionally, the analog storage circuit is coupled to a filter circuit or comprises a filter circuit, such as can be used to filter the input signal before storing one or more of the input signal (e.g., before sampling the input signal), or the analog representation of the slew rate of the input signal.

In an example, a method (such as a computer-implemented or machine-implemented method) can include using an electronic circuit to provide an extrapolation of an input signal during a specified hold duration, the method comprising establishing an analog representation of a slew rate of the input signal, storing analog representations of the input signal and the established slew rate, and providing to an output, during the specified hold duration, an extrapolated representation of the input signal using the analog representation of the input signal and the analog representation of the slew rate of the input signal. Optionally, the input signal can be filtered before establishing the slew rate or storing analog representations of the input signal or the slew rate.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 8A:
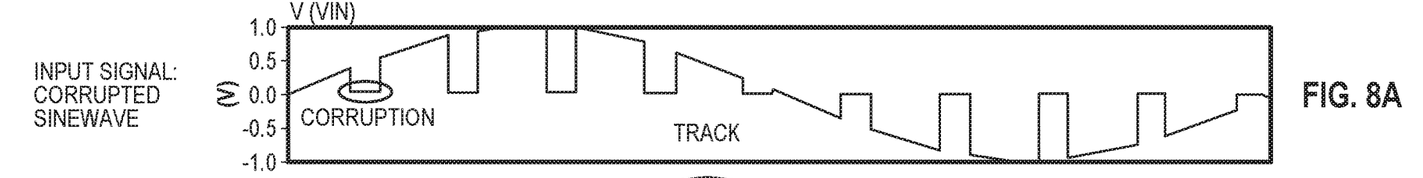
FIG. 8A, FIG. 8B, FIG. 8C, and FIG. 8D show illustrative examples comprising simulation results that provide a comparison between zeroth-order (e.g., FIG. 8B) and first-order (e.g., linear, FIG. 8C) track-and-hold techniques, as applied to an input signal (e.g., FIG. 8A) and controlled using track-and-hold durations respectively defined by a "Track/Hold" control signal (e.g., FIG. 8B).
Figures 8B, 8C:
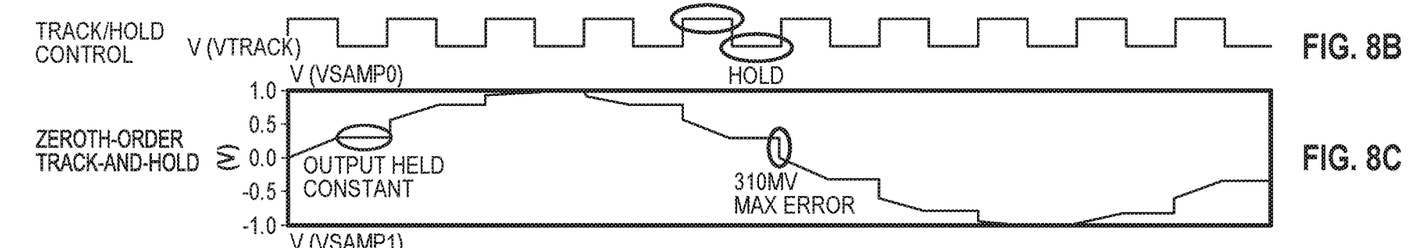

As mentioned above, electrical signals can be corrupted, such as at regular or specified intervals, such as when subjected to chopping in a chopped-amplifier circuit or when time-division multiplexed, as illustrative examples. For example, chopping circuits can be used in precision systems to suppress or inhibit error, such as offset error. Undesirable transients can occur when these circuits switch from one chop state to another chop state (as shown illustratively in the simulation of FIG. 8A). These transients can be reduced using one or more of a track-and-hold technique or filtering. FIG. 8C shows an illustrative example of an output waveform that can be provided by a zeroth-order track-and-hold technique. By contrast with a zeroth order technique, the present subject matter generally relates to techniques that can be used to provide track-and-hold behavior including extrapolation. Such extrapolation can be performed using a variety of techniques, such as implemented using one or more circuit shown herein. Also, as mentioned above, the present inventor has recognized, among other things, that use of analog circuits to implement the first-order extrapolation can one or more of reduce complexity of a circuit implementation or improve performance, such as by not requiring digital signal processing circuitry in performing the extrapolation.

Figure 1:
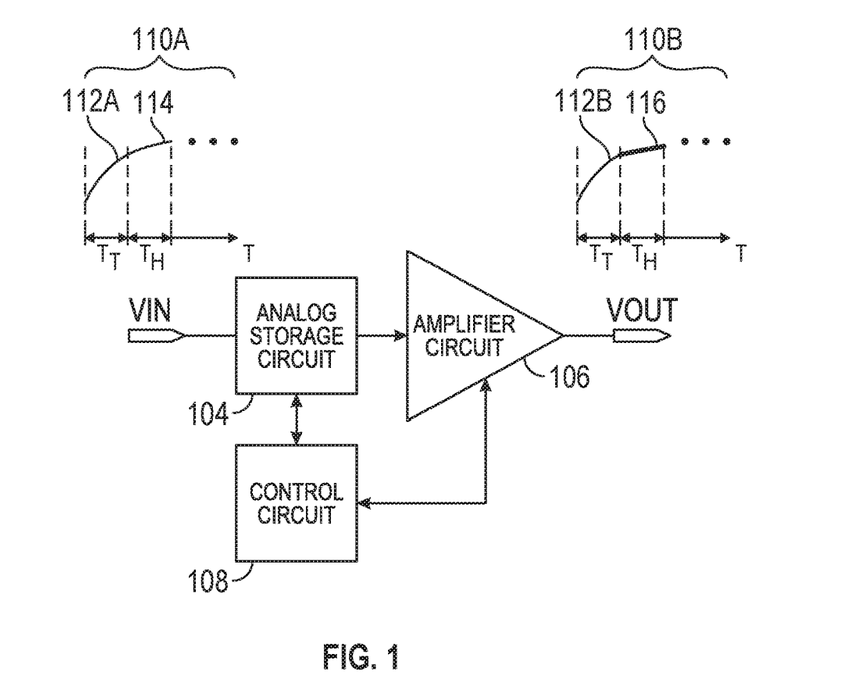
FIG. 1 illustrates generally an example comprising an electronic circuit, such as can be used to implement a first-order track-and-hold technique.

FIG. 1 illustrates generally an example comprising an electronic circuit 100, such as can be used to implement a first-order track-and-hold technique. In the example of the electronic circuit 100 of FIG. 1, an analog storage circuit 104 can be coupled to an amplifier circuit 106. In an example, the amplifier circuit 106 can include an operation amplifier topology, as shown and described in other examples herein. The operational amplifier topologies discussed herein can include a feedback network configured to provide unit-gain in closed-loop operation, but other topologies or feedback networks can be used, such as to provide gain values other than unity gain. One or more of the analog storage circuit 104 and the amplifier circuit can be controlled by a control circuit 108. The control circuit 108 can include one or more timers, buffers, logic circuitry, processing circuitry such as a microcontroller or microprocessor, registers, or memory devices. The control circuit 108 can be co-integrated in a commonly-shared mixed-signal integrated circuit along with a portion or an entirety of the analog storage circuit 104 and the amplifier circuit 106. Alternatively, or in addition, portions of the control circuit 108 can be separate from an integrated circuit comprising one or more of the amplifier circuit 106 or analog storage circuit 104. An output of the electronic circuit 100 can be provided to other downstream circuitry such as comprising one or more of an analog-to-digital converter, filter circuitry, or digital signal processing circuitry, as illustrative examples.

Figure 4:
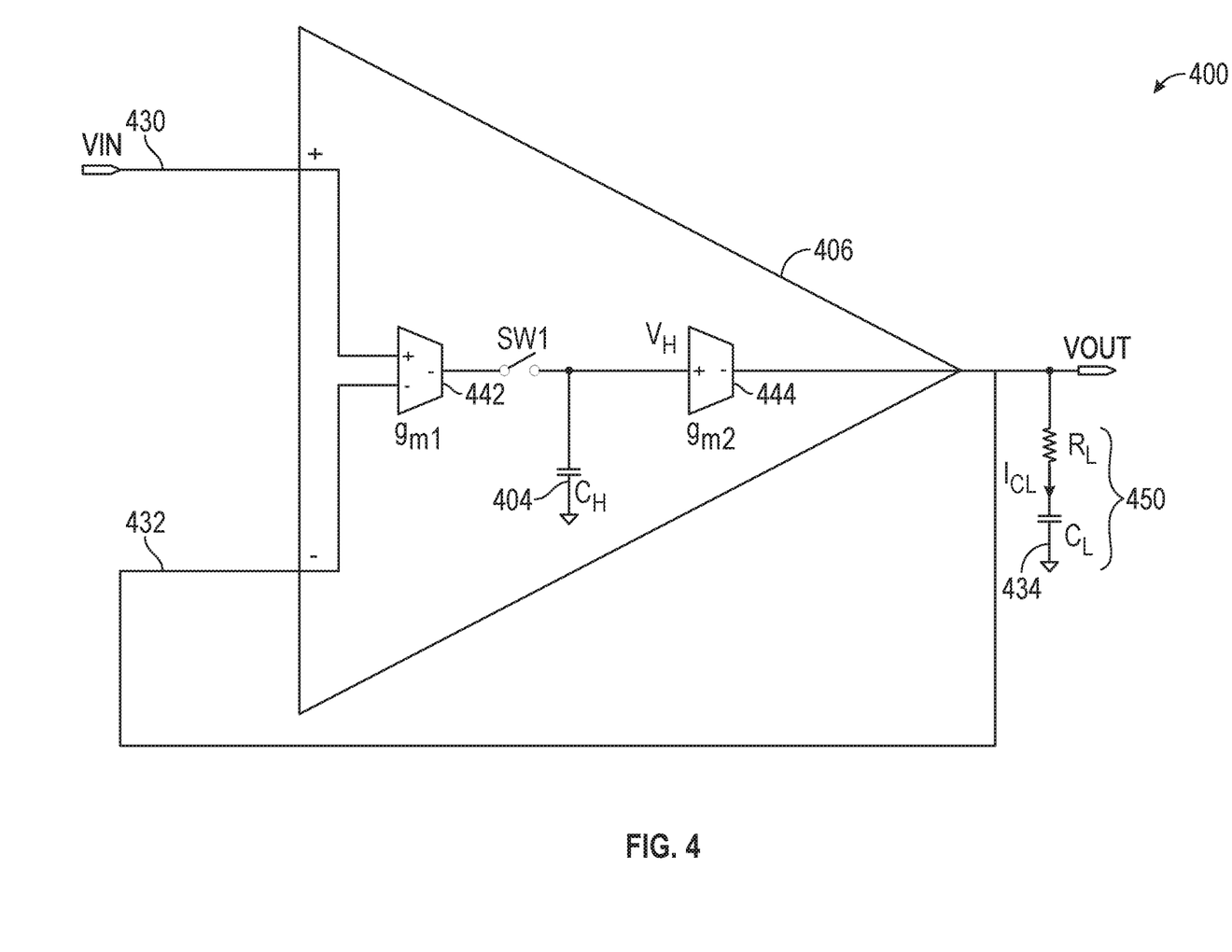
FIG. 4 illustrates generally yet another example comprising an electronic circuit, such as can be used to implement a first-order track-and-hold technique.

In FIG. 1, the analog storage circuit 104 is shown as separate from the amplifier circuit, but the analog storage circuit 104 can also be included as a portion of an amplifier circuit or related signal-chain, such as shown illustratively in other examples (e.g., such as in FIG. 4, where a hold capacitor 404 ($C_H$) is shown within an amplifier circuit 406). Returning to FIG. 1, an input signal 110A can be provided at an input node, VIN. The input signal can include portions 112A and 114 corresponding to a specified track duration, $T_T$, and a specified hold duration, $T_H$. The track duration $T_T$ and the hold duration $T_H$ can be established by the control circuit 108, such as used to control operation of one or more of the analog storage circuit 104 or the amplifier circuit 106.

During the track duration $T_T$, an output signal 110B provided by the amplifier circuit 106 can include a portion 112B closely representing the input signal portion 112A. For example, in a unit-gain topology, a one-to-one relationship can exist between an input signal portion 112A and an output signal portion 112B, showing that the output "tracks" the input signal during such a track duration $T_T$. By contrast, during the hold duration $T_H$, the output signal 110B can provide a first-order (e.g., linear) extrapolation 116 of the input signal such as by obtaining samples or estimates of the input signal magnitude 114 at the beginning of the hold duration $T_H$, and estimating a derivative (e.g., a slope or "slew rate") of the input signal 110A, such as obtained during the track duration $T_T$ or obtaining at the beginning of the hold duration $T_H$. The analog storage circuit can provide a representation of the input signal (e.g., a sample) at the beginning of the hold duration $T_H$, and the analog storage circuit can provide a representation of a slew rate of the input signal (e.g., a derivative estimate), such as for use in providing the linearly-extrapolated portion 116 of the output signal 110B, at the output node, VOUT. As an illustrative example, the output VOUT can be held initially at a value corresponding to the sampled representation of the input signal at the beginning of the hold duration, $T_H$, and the output VOUT can then be driven to increase or decrease in magnitude linearly in a manner corresponding to a sampled or estimated slew rate of the input signal.

Figure 2:
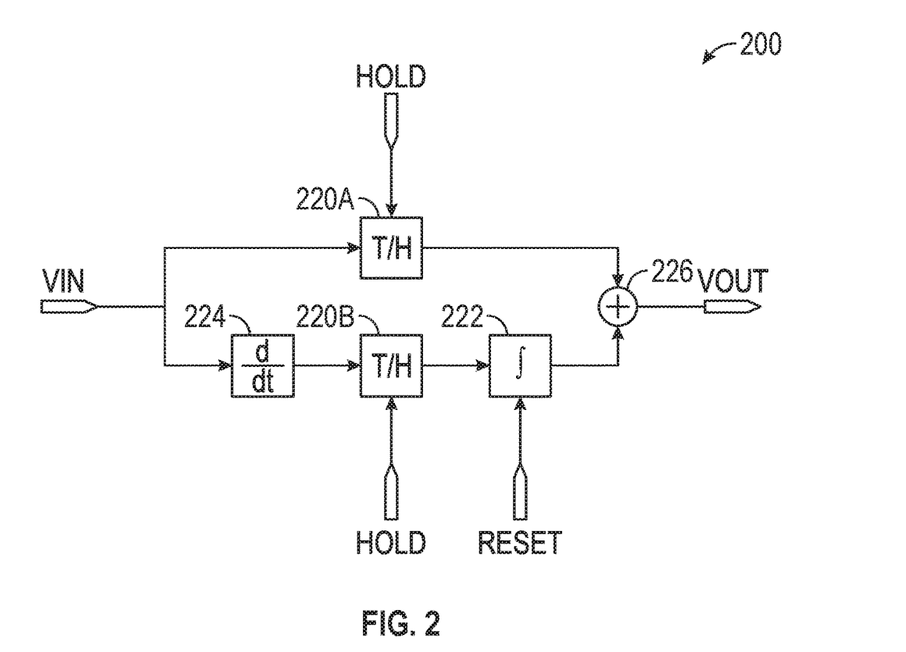
FIG. 2 illustrates generally a diagram showing a signal flow that can be used to describe a first-order track-and-hold technique.

The first-order extrapolation can be implemented using an analog circuit, such as implemented using a variety of different topologies. For example, switch-and-capacitor configurations can be used, as shown in the illustrative example of FIG. 3 and other examples. The first order track-and-hold technique can be understood in part such as by reference to FIG. 2, which illustrates generally a diagram showing a signal flow that can be used to describe a first-order track-and-hold technique. The flow shown in FIG. 2 is illustrative, and other topologies described herein need not exactly map to the signal flow of FIG. 2. In the example 200 of FIG. 2, an input signal can be provided to an input node, VIN. For example, the input signal can be a time-varying voltage waveform (e.g., a chopped or multiplexed signal waveform). In one signal path, a first track-and-hold (e.g., a zeroth-order track-and-hold) block 220A can provide an output to a summing block 226.

A second signal path can include a differentiator block 224 (e.g., "d/dt") that can provide an output representative of a slew rate or rate of change of the input signal (e.g., corresponding to a mathematical derivative of the input signal). A second track-and-hold block 220B can receive the slew rate representation from the differentiator block 224 and can provide an output to an integrator block 222. The integrator block 222 can be configured to "match" the differentiator block 224, such as to provide an output signal matching the input signal when the second track-and-hold block 220B is in a "track" state. When a "HOLD" signal is asserted, such as placing the first and second track-and-hold blocks 220A and 220B in a "hold" state, the track-and-hold blocks 220A and 220B can sample a signal value at their inputs and provide a constant output representative of the sampled signal value. If an analog storage technique is used, the signal value can be represented by a voltage or charge stored using a capacitor. When an output of the differentiator block 224 is sampled, the output of the second track-and-hold block 220B can be constant. When such a constant value is integrated by the integrator block 222, the output of the integrator block 222 can represent a linearly-varying signal, such as having a slope or slew rate corresponding to the sampled, held representation of the output of the differentiator block 224. This linearly-varying signal can be added, using the summing block 226, to the output of the first track-and-hold block 220A, such as to provide a linearly-extrapolated time-varying signal at VOUT, during a specified hold duration controlled by the HOLD signal. To avoid error in the output after the HOLD duration is completed, the integrator block 222 can include a RESET input to zero the integrator output when RESET is asserted.

Figure 3:
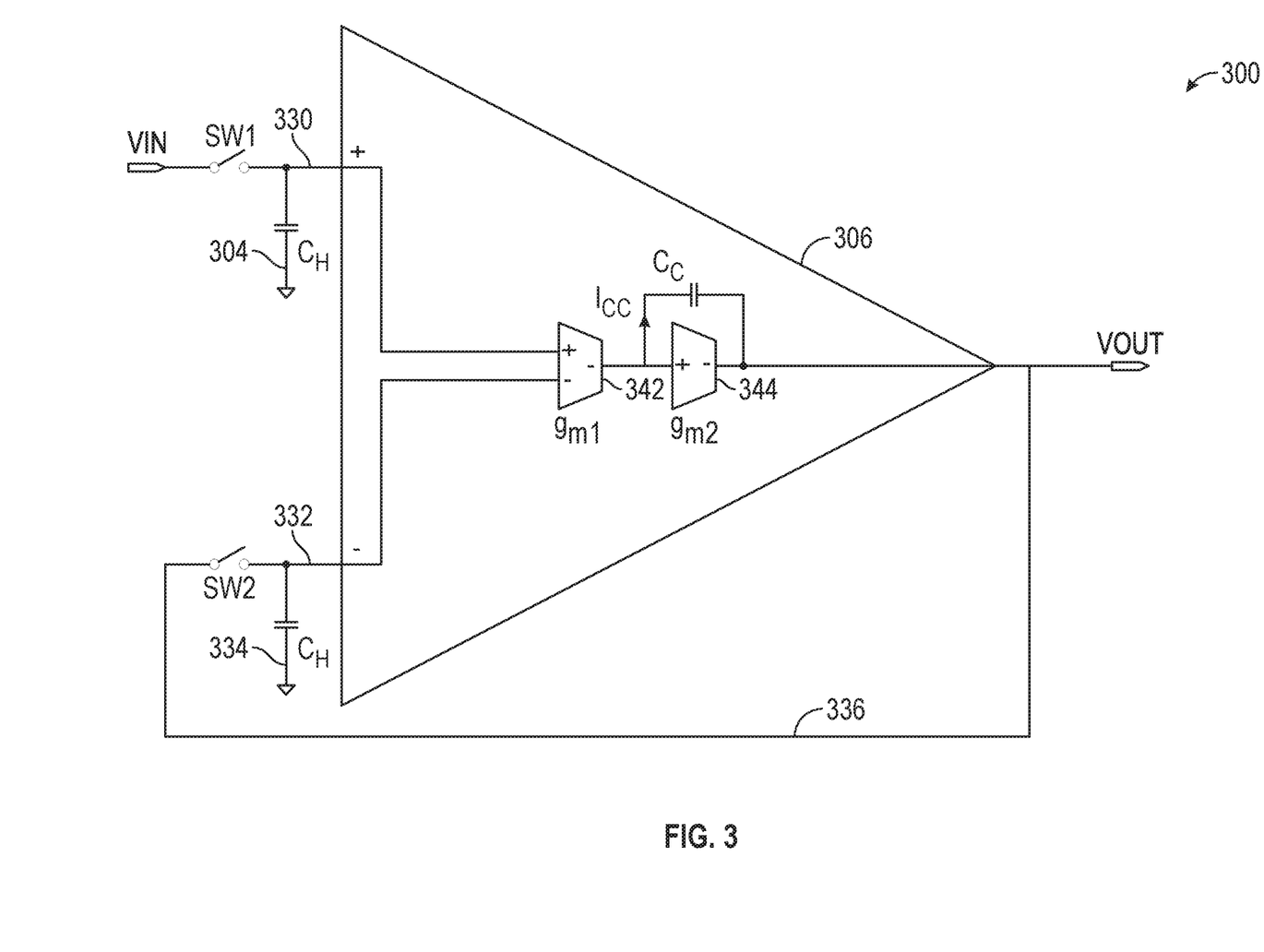
FIG. 3 illustrates generally an example comprising an electronic circuit, such as can be used to implement a first-order track-and-hold technique.

FIG. 3 illustrates generally an example comprising an electronic circuit 300, such as can be used to implement a first-order track-and-hold technique. The electronic circuit 300 can include two functional blocks, comprising an analog storage circuit (including switches SW1 and SW2 coupled to capacitors 304 and 334, respectively). The electronic circuit 300 can also include an amplifier circuit 306 (e.g., an operational amplifier). The electronic circuit 300 can operate according to two modes, including a track mode and a hold mode.

In the track mode, when switches SW1 and SW2 are closed (such as in response to a signal from a control circuit), the electronic circuit 300 can operate as a unity gain buffer, where an output node, VOUT, tracks an input node, VIN. A derivative value (e.g., a slope of VOUT) can be shown to be proportional to a current, $I_{CC}$, and also to the amplifier circuit 306 (e.g., operational amplifier) differential input voltage. In a hold mode, when both switches SW1 and SW2 are opened contemporaneously, the amplifier circuit 306 differential input voltage is held constant (e.g., because feedback 336 from the output node, VOUT, is isolated from the inverting input node 332 and the input node, VIN, is isolated from the non-inverting input node 330). Accordingly, $I_{CC}$ at the output of the first transconductance stage 342 (gm1) remains constant, causing the slope of the output voltage VOUT to be held constant (e.g., approximating a constant-valued mathematical derivative) at the output of a second transconductance stage 344 (gm2). Because a magnitude of a voltage at the VOUT node continues increase or decrease at a constant rate, the VOUT voltage can correspond to a linear extrapolation from the input signal in the hold mode. Such linear extrapolation can be performed in the presence of different feedback circuit topologies, so different closed-loop gains (other than the unit-gain configuration of FIG. 3) can be used.

Examples such as the electronic circuit 300 shown in FIG. 3 illustrate voltage-mode input and output, but other circuit topologies can be used (such as a current mode topology, or such as using a voltage amplifier, internally, instead of the second transconductance stage, for example). Generally, an operational amplifier can be implemented or represented by two transconductance amplifiers, gm1, gm2, and a compensation capacitor, $C_C$, as shown within the amplifier circuit 306 of FIG. 3, but other amplifier circuit 306 topologies can be used.

FIG. 4 illustrates generally yet another example comprising an electronic circuit 400, such as can be used to implement a first-order track-and-hold technique. The electronic circuit 300 in the example of FIG. 3 may be sensitive to noise in the input signal presented to VIN, or other effects, such as one or more of charge injection mismatch or switch leakage mismatch. Other examples described in this document can be used to compensate for one or more of such challenges, such as providing one or more of higher input impedance or reduced phase lag in a feedback loop. In the example of the electronic circuit of FIG. 4, the analog storage circuit include a capacitor 404 ($C_H$) located within the amplifier circuit 406, such as located between a first transconductance stage 442 (gm1) and a second transconductance stage 444 (gm2).

Analog storage of a representation of the slew rate of the input signal VIN at the non-inverting node 430 of the amplifier circuit 406 can be performed using a resistor and capacitor (RC) circuit 450 at the output VOUT of the amplifier circuit 406. A capacitor 434 (CL) at the output of the amplifier circuit 406 can be used to detect a slope (e.g., representing a mathematical derivative) of the output signal at VOUT, where $I_{CL}$ can represent the slope or slew-rate value, and where a sampled voltage $V_H$, stored using capacitor 404, is provided to the second transconductance stage 444 (gm2) to generate $I_{CL}$. During a track mode of operation, switch SW1 can be closed, and the electronic circuit 400 acts as a voltage buffer (with feedback provided to the inverting node 432) where an output signal at the node VOUT tracks the input signal provided to the input node VIN. When SW1 is opened (e.g., at the beginning of a specified hold duration), $V_H$ is stored on the capacitor 404, resulting in a constant output current from the second transconductance stage 444. The resistor $R_L$ can be included, such as optionally, such as to reduce phase delay at high frequencies, and compensation can be provided as mentioned in relation to other examples.

Figure 5:
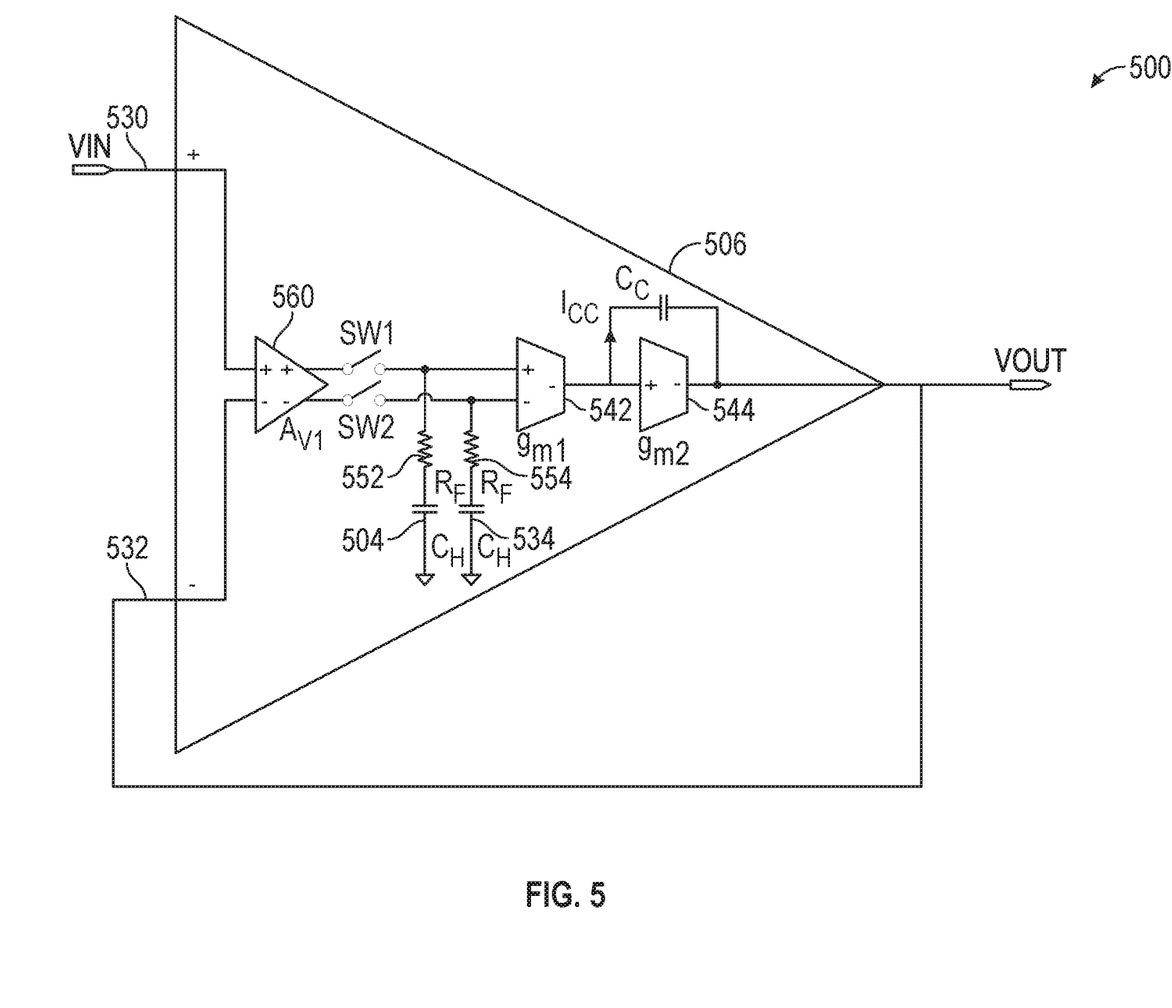
FIG. 5 illustrates generally yet another example comprising an electronic circuit, such as can be used to implement a first-order track-and-hold technique.

FIG. 5 illustrates generally yet another example comprising an electronic circuit 500, such as can be used to implement a first-order track-and-hold technique. In the example of the electronic circuit 500 of FIG. 5, an input signal can be provided to a non-inverting node 530 of an amplifier circuit 506. The amplifier circuit can provide unity gain using feedback to an inverting node 532, in a manner similar to other examples mentioned herein. By contrast with other examples, the amplifier circuit 506 can include a gain stage 560 having a gain $A_{V1}$, such as to compensate for errors or otherwise suppress errors introduced by switches SW1 and SW2, and to provide a higher input impedance by comparison with other examples (such as by comparison with the electronic circuit 300 of FIG. 3). The operation of the electronic circuit 500 can be similar to the examples described above and below, where switches SW1 and SW2 are closed during a specified track duration (e.g., a track mode), where a voltage at the output node VOUT tracks an input signal provided to the input node VIN. As in other examples described herein, a voltage difference between voltage values stored using capacitors 504 and 534 can represent a slew rate or slope of the input signal. When switches SW1 and SW2 are opened, a first transconductance stage 542 (gm1) establishes a constant current, ICC representative of the voltage difference between capacitors 504 and 534, resulting in a linearly-ramping voltage at an output of the second transconductance stage 544, corresponding to VOLT. The configuration shown in FIG. 5 can include filter resistors 552 and 554 (e.g., "$R_F$") in series with analog storage capacitors 504 and 534, such as to reduced sampled noise without destabilizing the amplifier circuit 506.

Figure 6:
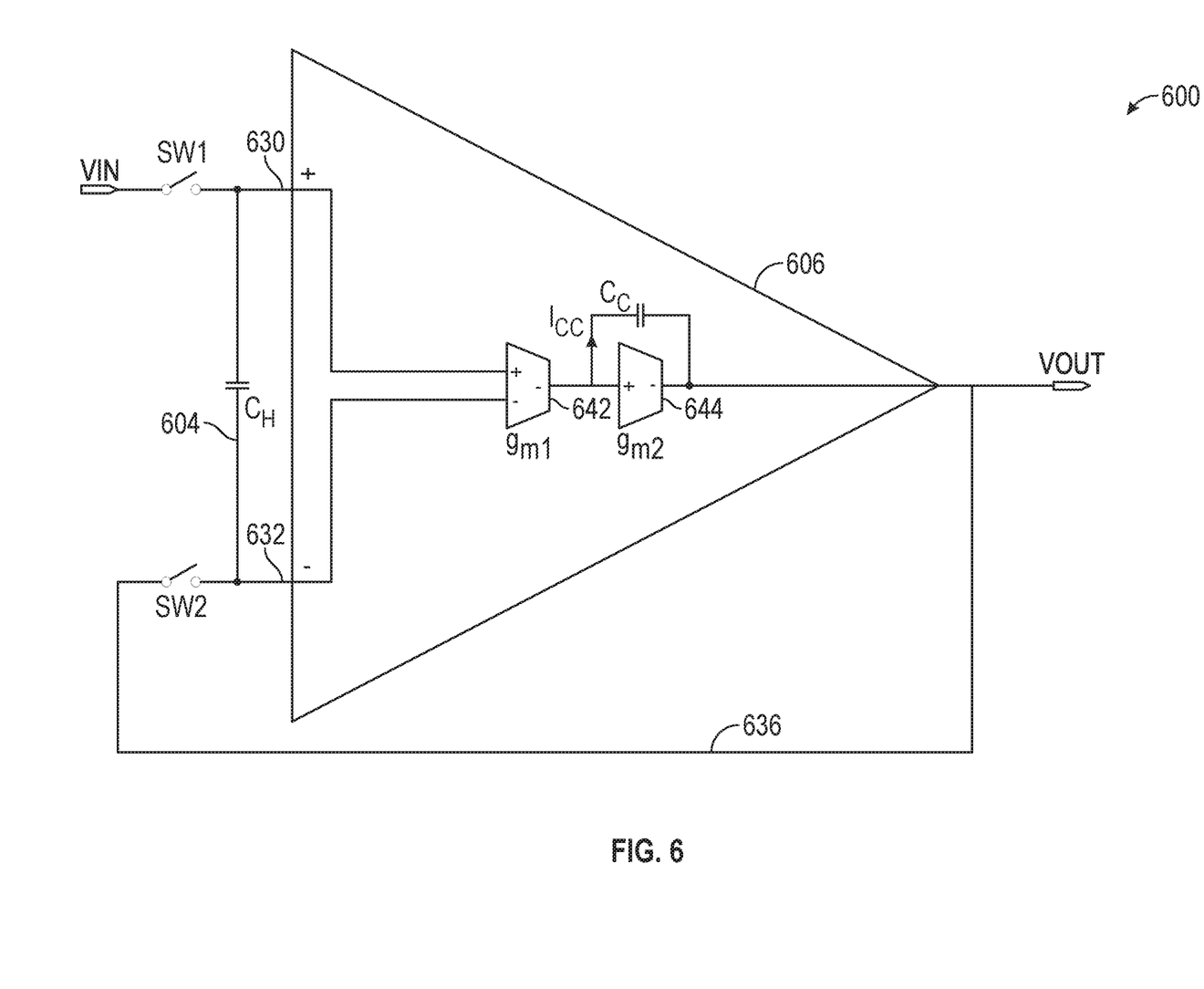
FIG. 6 illustrates generally yet another example comprising an electronic circuit, such as can be used to implement a first-order track-and-hold technique.

FIG. 6 illustrates generally yet another example comprising an electronic circuit 600, such as can be used to implement a first-order track-and-hold technique. The example of FIG. 6 can provide a simplified implementation as compared to other examples. In the example of FIG. 6, switch SW1 can be located between a terminal of a storage capacitor 604 ($C_H$) and an input node, VIN, and switch SW2 can be located between an output node VOUT (e.g., coupled to the output using a feedback line 636) and a second terminal of the storage capacitor 604. In a manner similar to the example of FIG. 3, the electronic circuit 600 can support a track mode and a hold mode, such as to provide an output signal at the output node VOUT that tracks the input signal at VIN when switches SW1 and SW2 are closed, using a unit-gain op-amp topology for an amplifier circuit 606, including first and second transconductance stages 642 and 644. When switches SW1 and SW2 are opened, such as contemporaneously, to establish a hold mode, a differential voltage provided between the inverting node 632 and non-inverting node 630 can establish an analog representation (e.g., a sample) of an input signal slope. The first transconductance stage 642 can generate a constant current $I_{CC}$, and the second transconductance stage 644 can integrate the constant current $I_{CC}$ to provide a linearly-varying output voltage representing a linear extrapolation of the input signal.

Figure 7:
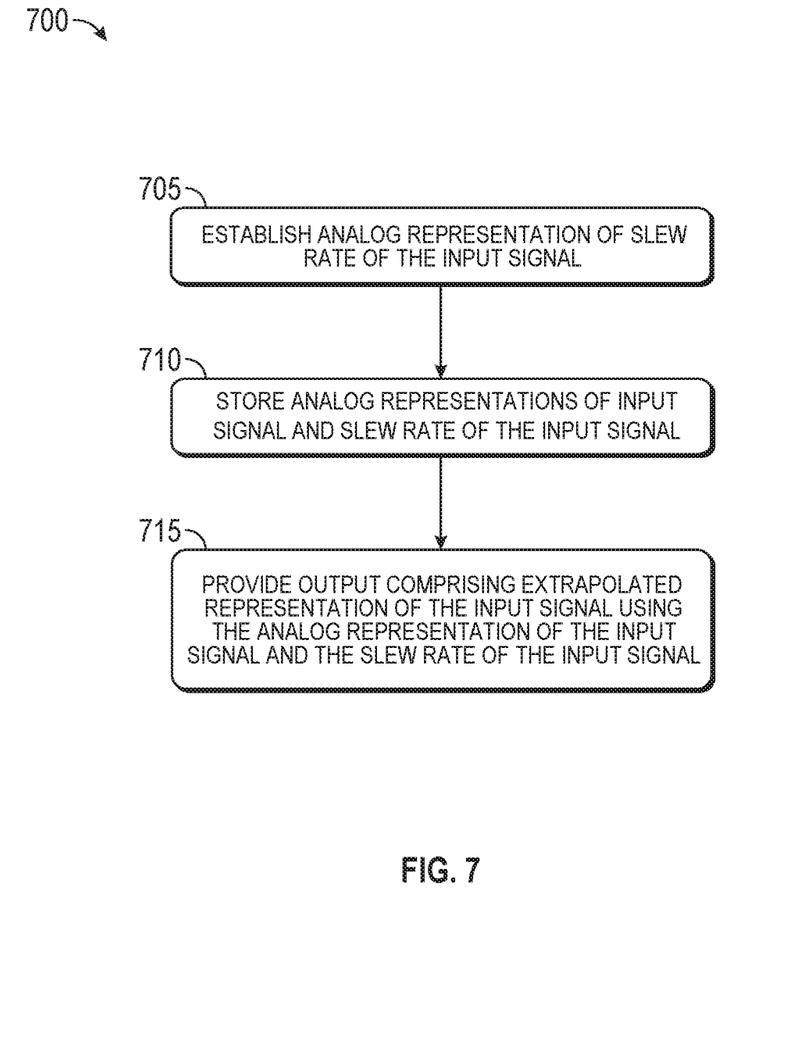
FIG. 7 illustrates generally a technique, such as a method, that can include providing an extrapolated representation of an input signal, such as can be performed at least in part using one or more of the electronic circuits shown in other examples herein, such as shown illustratively in FIG. 1, FIG. 2, FIG. 3, FIG. 4, FIG. 5, or FIG. 6.

FIG. 7 illustrates generally a technique 700, such as a method, that can include providing an extrapolated representation of an input signal, such as can be performed at least in part using one or more of the electronic circuits shown in other examples herein, such as shown illustratively in FIG. 1, FIG. 2, FIG. 3, FIG. 4, FIG. 5, or FIG. 6. The method shown in FIG. 7 can be implemented at least in part in an automated manner, such as under the control of a microcontroller, microprocessor, state machine, or other logic circuitry. At 705, an analog representation of a slew rate of an input signal can be established. Such a slew rate can correspond to a slope or mathematical derivative of an input signal. For example, as shown and described in relation to various electronic circuits discussed above, a difference in voltage between inverting and non-inverting inputs of an operational amplifier can provide information indicative of a slope or slew rate of the input signal, and such a voltage difference can be stored or otherwise sampled, such as using capacitor and switch circuits according to various examples. For example, at 710, analog representations of the input signal and the established slew rate can be stored, such as triggered in response to a transition between a track mode and a hold mode. At 715, an output can be provided comprising an extrapolated representation of the input signal, such as using the stored analog representations of the input signal and the slew rate of the input signal. For example, a stored representation of the slew rate can be used as an input to an integrator circuit to provide an output voltage or other signal that ramps linearly in a manner having a slew rate corresponding to sampled slew rate of the input signal. The ramping signal can be added to a sampled representation of the input signal (e.g., summing the input signal sample with the ramp signal, as shown illustratively in FIG. 2).

Generally, the electronic circuit topologies discussed in relation to the examples of FIG. 1, FIG. 3, FIG. 4, FIG. 5, FIG. 6, and FIG. 7 can be implemented at least in part as a portion or an entirety of an integrated circuit device, or within an integrated circuit device package. As an illustrative example, of an analog storage circuit can be integrated within the integrated circuit, coupled to an integrated circuit and located within a commonly-shared integrated circuit device or module package, or included as discrete components coupled to an integrated circuit when the electronic circuit as implemented using a printed circuit or printed wiring assembly.

FIG. 8A, FIG. 8B, FIG. 8C, and FIG. 8D show illustrative examples comprising simulation results that provide a comparison between zeroth-order (e.g., FIG. 8B) and first-order (e.g., linear, FIG. 8C) track-and-hold techniques, as applied to an input signal (e.g., FIG. 8A) and controlled using track-and-hold durations respectively defined by a "Track/Hold" control signal (e.g., FIG. 8B). In the illustrative example of FIG. 8A, a chopped sinusoidal waveform is shown. The portion labeled "corruption" can represent a chopped region of the waveform (e.g., portions of the waveform show significant chopping artifact). Such chopping can be performed as a portion of a signal chain in a precision measurement system, such as for stabilization or offset control. In a synchronous scheme, a control signal such as shown in FIG. 8B can be provided, such as having specified track durations corresponding to uncorrupted portions of the signal of FIG. 8A, and the control signal in FIG. 8B can have specified hold durations overlapping with corrupted portions of the signal of FIG. 8A. For example, the hold durations can encompass an entirety of a duration of a corrupted portion of the input signal, such as to provide time to perform sampling of an uncorrupted portion of the input signal and to establish a sample or other representation of the slew rate of the uncorrupted portion of the input signal.

Figure 8D:
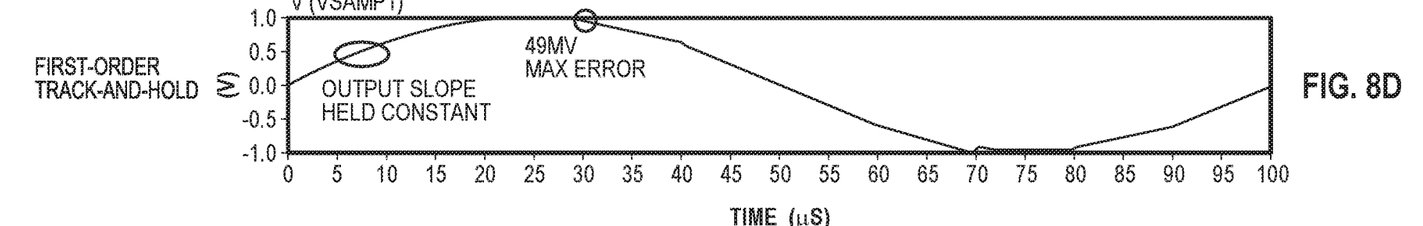

As mentioned above, if slew rate information is not obtained, and a zeroth-order approach is used (such as can be referred to as a "sample and hold" approach), an output of a zeroth-order track-and-hold circuit can provide a waveform as shown illustratively in FIG. 8C. Because an output is held constant during the specified hold duration, significant deviation can occur between a desired continuous sinewave (reconstructed waveform) and the distorted zeroth-order track-and-hold waveform. Discontinuities in the zeroth-order waveform can be filtered to some extent, but such a waveform is still significantly distorted versus a clean (e.g., unchopped) sine wave. In FIG. 8D, a first-order track-and-hold approach is simulated. During the specified hold durations, a first-order (e.g., linear extrapolation) is performed. While not a perfect approximation of a clean (unchopped) sine wave, the example of FIG. 8D shows that a better approximation of the clean sine wave is obtained as compared to FIG. 8C. For example, in the illustrations of FIG. 8C and FIG. 8D, there is 310 milliVolts (mV) of maximum error using the zeroth-order approach, and 49 mV of maximum error using the first-order approach. The first-order approach can have drawbacks depending on the circuit topology. For example, if input filtering is relaxed and significant noise is present, a slew rate estimate can be skewed resulting in a poorer approximation of the uncorrupted input signal. As discussed above, various techniques can be used to suppress or inhibited such erroneous extrapolation, such as by filtering a signal to be sampled, or by using a gain stage to compensate for error introduced by series switches forming a portion of an analog storage circuit.

Figure 9A:
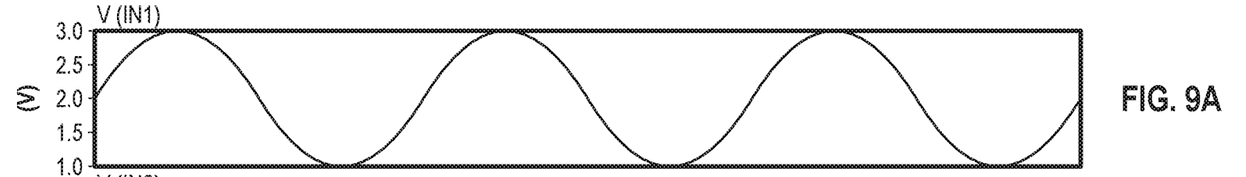
FIG. 9A, FIG. 9B, 9C, 9D, and FIG. 9E shows signals relating to an illustrative example comprising simulation results that illustrate a technique for using a first-order track-and-hold technique for demultiplexing components of an input signal shown in FIG. 9C (e.g., including a time-division multiplexed representation of first and second signal components respectively shown in FIG. 9A and FIG. 9B), such as for a time-division multiplexing application, where the first and second signal components are recovered as shown illustratively in FIG. 9D and FIG. 9E, respectively.
Figure 9B:
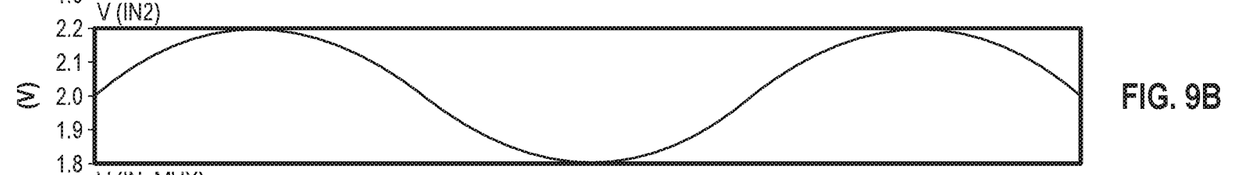
Figure 9C:
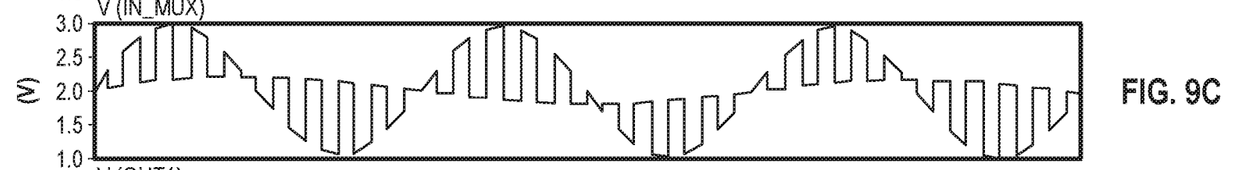
Figure 9D:
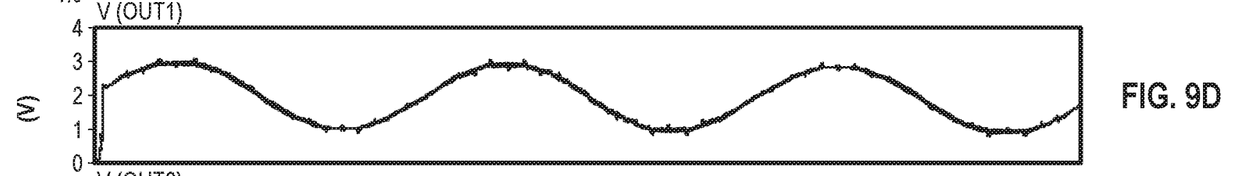
Figure 9E:
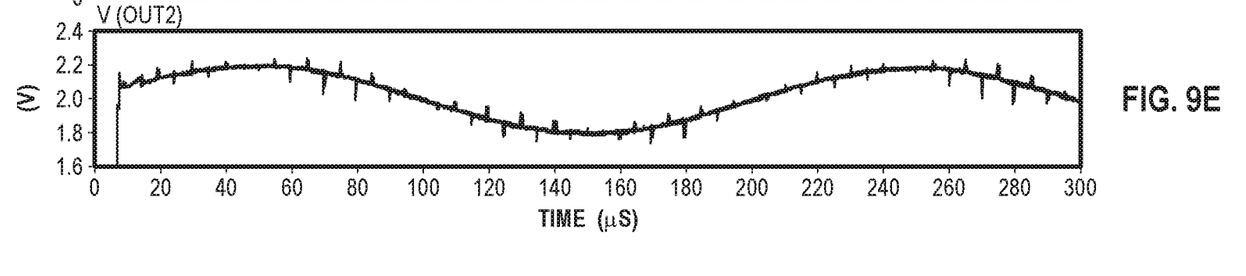

FIG. 9A, FIG. 9B, FIG. 9C, FIG. 9D, and FIG. 9E shows signals relating to an illustrative example comprising simulation results that illustrate a technique for using a first-order track-and-hold technique for demultiplexing components of an input signal shown in FIG. 9C (e.g., including a time-division multiplexed representation of first and second signal components respectively shown in FIG. 9A and FIG. 9B), such as for a time-division multiplexing application, where the first and second signal components are recovered as shown illustratively in FIG. 9D and FIG. 9E, respectively. In FIG. 9A, a first input signal includes a sinusoidal waveform corresponding to a first input signal frequency. In FIG. 9B, a second input signal includes a sinusoidal waveform corresponding to a second input signal frequency. The use of sinusoidal input waveforms is illustrative, and other waveforms can be used.

In FIG. 9C, a time-division multiplexed representation of portions of the first and second signal waveforms is shown. Two first-order track-and-hold circuits can be used to separately recover or reconstruct the first and second input waveforms. For example, in FIG. 9D, a first track-and-hold circuit can be used such as tracking the multiplexed signal in FIG. 9C during durations where the first input signal is being output in the multiplexed waveform, and linearly extrapolating from such tracking during durations where the second input signal is being output in the multiplexed waveform. In FIG. 9E, a second track-and-hold circuit can be used, such as tracking the multiplexed signal in FIG. 9D during durations where the second input signal is being output in the multiplexed waveform, and linearly extrapolating from such tracking during durations where the first input signal is being output. In this manner, the first and second input signals can be recovered or reconstructed from the multiplexed signal waveform of FIG. 9C.

Each of the non-limiting aspects described in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be com- The claimed invention is:

1. An electronic circuit to provide an extrapolation of an input signal during a specified hold duration, the electronic circuit comprising:
   an analog amplifier circuit coupled to or comprising an analog storage circuit, the analog storage circuit coupled to a filter circuit or comprising a filter circuit, the analog storage circuit controllably coupled to an input node to store an analog representation of the input signal, and the amplifier circuit comprising an output configured to provide, during the specified hold duration, an extrapolated representation of the input signal using the analog representation of the input signal and an analog representation of a slew rate of the input signal; and
   a control circuit configured to controllably isolate the analog storage circuit from the input during the specified hold duration.

2. The electronic circuit of claim 1, wherein the output of the analog amplifier circuit is configured to provide, during a specified track duration, an output signal that tracks the input signal; and
   wherein the control circuit is configured to controllably connect the analog storage circuit to the input during the specified track duration.

3. The electronic circuit of claim 1, wherein the analog storage circuit comprises a first capacitor having a terminal coupled to a non-inverting node defined by the amplifier circuit, the first terminal isolated from the input during the specified hold duration by a first switch, the first switch configured to be controlled by the control circuit.

4. The electronic circuit of claim 3, wherein a second terminal of the first capacitor is coupled to an inverting node defined by the amplifier circuit; and
   wherein the analog representation of the slew rate of the input signal is represented by a voltage drop across inverting and non-inverting nodes defined by the amplifier circuit.

5. The electronic circuit of claim 4, wherein a second switch is located in series between the output and the inverting node defined by the amplifier circuit; and
   wherein, during the specified hold duration, the first and second switches are configured to open under the control of the control circuit, and, during the specified track duration, the first and second switches are configured to close under the control the of the control circuit.

6. The electronic circuit of claim 3, comprising a second capacitor coupled to an inverting node along a signal path defined by the amplifier circuit, and
   wherein the amplifier circuit is configured to establish the analog representation of the slew rate of the input signal using a difference in voltage values stored by the first and second capacitors.

7. The electronic circuit of claim 6, wherein the first switch is located in series between the input node and a circuit comprising the first capacitor; and
   wherein the electronic circuit comprises a second switch in series between the output of the amplifier circuit and a circuit comprising the second capacitor.

8. The electronic circuit of claim 7, comprising a gain stage in series with the first and second switches.

9. The electronic circuit of claim 7, comprising a first resistor in series with the first capacitor, and a second resistor in series with the second capacitor.

10. The electronic circuit of claim 1, wherein the extrapolation represents a linear extrapolation.

11. The electronic circuit of claim 1, wherein the input signal includes a duration where the input signal is corrupted or distorted; and
   wherein the control circuit is configured to establish the specified hold duration to overlap with the duration of the input signal that is corrupted or distorted.

12. The electronic circuit of claim 1, wherein the analog storage circuit is coupled to a filter circuit.

13. The electronic circuit of claim 1, wherein the analog storage circuit comprises a filter circuit.

14. A method of using an electronic circuit to provide an extrapolation of an input signal during a specified hold duration, the method comprising:
   establishing an analog representation of a slew rate of the input signal;
   storing analog representations of the input signal and the established slew rate including filtering the input signal to reduce noise before storing the analog representations of the input signal and the slew rate; and
   providing to an output, during the specified hold duration, an extrapolated representation of the input signal using the analog representation of the input signal and the analog representation of the slew rate of the input signal.

15. The method of claim 14, wherein storing the analog representation of the input signal includes controllably coupling the input to an analog storage circuit during a specified track duration, the output tracking the input during the specified track duration; and
   wherein providing the extrapolated representation of the input signal includes controllably isolating the analog storage circuit from the input during the specified hold duration.

16. The method of claim 14, wherein establishing the analog representation of the slew rate of the input signal comprising determining a voltage difference between two capacitors, the two capacitors storing a sample of the input signal and a sample of a feedback signal, respectively.

17. The method of claim 14, wherein establishing the analog representation of the slew rate of the input signal comprising determining a voltage difference across a capacitor, the capacitor having a first terminal controllably coupled to an input of an amplifier circuit and a second terminal controllably coupled to an output of the amplifier circuit.

18. The method of claim 14, wherein the extrapolation represents a linear extrapolation.

19. The method of claim 14, wherein the input signal includes a duration where the input signal is corrupted or distorted; and
   wherein the method comprises establishing the specified hold duration to overlap with the duration of the input signal that is corrupted or distorted.

20. An electronic circuit to provide an extrapolation of an input signal during a specified hold duration, the electronic circuit comprising:
   a means for establishing an analog representation of a slew rate of the input signal;
   a means for storing analog representations of the input signal and the established slew rate;
   a means for filtering the input signal to reduce noise before storing the analog representations of the input signal and the slew rate; and a means for providing to an output, during the specified hold duration, an extrapolated representation of the input signal using the analog representation of the input signal and the slew rate of the input signal.

21. The electronic circuit of claim 20, wherein the extrapolation represents a linear extrapolation.

22. The electronic circuit of claim 20, wherein the input signal includes a duration where the input signal is corrupted or distorted; and wherein the electronic circuit comprises a means for establishing the specified hold duration to overlap with the duration of the input signal that is corrupted or distorted.

* * * * *